US010756738B2

(12) United States Patent
Reohr et al.

(10) Patent No.: US 10,756,738 B2
(45) Date of Patent: *Aug. 25, 2020

(54) JTL-BASED SUPERCONDUCTING LOGIC ARRAYS AND FPGAS

(71) Applicant: NORTHROP GRUMMAN SYSTEMS CORPORATION, Falls Church, VA (US)

(72) Inventors: William Robert Reohr, Severna Park, MD (US); Randall M. Burnett, Catonsville, MD (US); Randal L. Posey, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/546,952

(22) Filed: Aug. 21, 2019

(65) Prior Publication Data
US 2020/0028512 A1 Jan. 23, 2020

Related U.S. Application Data

(63) Continuation of application No. 16/037,587, filed on Jul. 17, 2018, now Pat. No. 10,447,278.

(51) Int. Cl.
*H03K 19/195* (2006.01)
*H03K 19/17704* (2020.01)
(Continued)

(52) U.S. Cl.
CPC .......... *H03K 19/195* (2013.01); *G06N 10/00* (2019.01); *H03K 19/1776* (2013.01);
(Continued)

(58) Field of Classification Search
CPC .......... H03K 19/195; H03K 19/17736; H03K 19/17708; H03K 19/1776; G06N 99/002; G11C 11/44
See application file for complete search history.

(56) References Cited

U.S. PATENT DOCUMENTS 3,613,699 A   10/1971 Holm
4,151,605 A    4/1979 Faris
(Continued)

FOREIGN PATENT DOCUMENTS

JP    H01125688 A   5/1989
JP      5190922 B2   4/2013
(Continued)

OTHER PUBLICATIONS

Partial Search Report fmom PCT/US2019/037747 dated Oct. 2, 2019.
(Continued)

*Primary Examiner* — Seokjin Kim
(74) *Attorney, Agent, or Firm* — Tarolli, Sundheim, Covell & Tummino LLP

(57) ABSTRACT

Superconducting logic arrays (SLAs) and field-programmable gate arrays (FPGAs) that are based on Josephson transmission lines (JTLs) accommodate reciprocal quantum logic (RQL) compliant binary input signals and provide RQL-compliant output signals that are evaluations of generalized logic functions. Each JTL-based superconducting FPGA (JTLBSFPGA) incorporates multiple JTL-based SLAs (JTLBSLAs) connected together. Each JTLBSLA includes an array of software-programmable and/or maskprogrammed logic cells that output products of inputs and cell states, such that the JTLBSLAs output evaluations of sum-of-products functions. New JTLBSLA logic cells are described, including some that provide programmable cell states via magnetic Josephson junctions (MJJs). JTLBSFP-
(Continued)

GAs provide area efficiency and clock speed advantages over CMOS FPGAs. Unlike SLAs based on Josephson magnetic random access memory (JMRAM), JTLBSLAs do not require word line drivers, flux pumps, or sense amplifiers. Because JTLBSLAs and JTLBSFPGAs are RQL-compliant, they can also include RQL gates connected within or between them, without signal conversion circuitry.

18 Claims, 8 Drawing Sheets

(51) Int. Cl.
    *H03K 19/1776*      (2020.01)
    *H03K 19/17736*      (2020.01)
    *G06N 10/00*      (2019.01)
    *G11C 11/44*      (2006.01)

(52) U.S. Cl.
    CPC . *H03K 19/17708* (2013.01); *H03K 19/17736* (2013.01); *G11C 11/44* (2013.01)

(56) References Cited

U.S. PATENT DOCUMENTS

| | | | |
|---|---|---|---|
| 4,360,898 | A | 11/1982 | Faris |
| 4,601,015 | A | 7/1986 | Ishida |
| 4,912,679 | A | 3/1990 | Shinoda et al. |
| 4,916,335 | A | 4/1990 | Goto et al. |
| 5,114,912 | A | 5/1992 | Benz |
| 5,229,962 | A | 7/1993 | Yuh et al. |
| 5,260,264 | A | 11/1993 | Kurosawa et al. |
| 5,276,639 | A | 1/1994 | Inoue |
| 5,309,038 | A | 5/1994 | Harada et al. |
| 5,323,344 | A | 6/1994 | Katayama et al. |
| 5,365,476 | A | 11/1994 | Mukhanov |
| 5,793,697 | A | 8/1998 | Scheuerlein |
| 5,872,731 | A | 2/1999 | Chan et al. |
| 5,942,765 | A | 8/1999 | Miyahara et al. |
| 5,943,284 | A | 8/1999 | Mizuno et al. |
| 6,078,517 | A | 6/2000 | Herr |
| 6,242,939 | B1 | 6/2001 | Nagasawa et al. |
| 6,335,890 | B1 | 1/2002 | Reohr et al. |
| 6,389,505 | B1 | 5/2002 | Emma et al. |
| 6,418,065 | B2 | 7/2002 | Sato |
| 6,483,339 | B1 | 11/2002 | Durand et al. |
| 6,545,906 | B1 | 4/2003 | Savtchenko et al. |
| 6,670,807 | B2 | 12/2003 | Cox |
| 6,680,868 | B2 | 1/2004 | Akamatsu |
| 6,836,141 | B2 | 12/2004 | Herr |
| 6,960,929 | B2 | 11/2005 | Bedard |
| 7,129,869 | B2 | 10/2006 | Furuta et al. |
| 7,252,852 | B1 | 8/2007 | Parkin |
| 7,365,663 | B2 | 4/2008 | Rylov et al. |
| 7,443,719 | B2 | 10/2008 | Kirichenko et al. |
| 7,505,310 | B2 | 3/2009 | Nagasawa et al. |
| 7,535,069 | B2 | 5/2009 | Abraham et al. |
| 7,786,748 | B1 | 8/2010 | Herr |
| 7,876,145 | B2 | 1/2011 | Koch |
| 7,977,964 | B2 | 7/2011 | Herr |
| 8,208,288 | B2 | 6/2012 | Bulzacchelli et al. |
| 8,270,209 | B2 | 9/2012 | Herr et al. |
| 8,547,732 | B2 | 10/2013 | Bulzacchelli et al. |
| 8,971,977 | B2 | 3/2015 | Mukhanov et al. |
| 9,013,916 | B2 | 4/2015 | Naaman et al. |
| 9,208,861 | B2 | 12/2015 | Herr et al. |
| 9,251,057 | B2 | 2/2016 | Higo et al. |
| 9,281,057 | B1 | 3/2016 | Herr et al. |
| 9,384,827 | B1 | 7/2016 | Reohr et al. |
| 9,443,576 | B1 | 9/2016 | Miller |
| 9,455,707 | B2 | 9/2016 | Herr et al. |
| 9,520,181 | B1* | 12/2016 | Miller .................. G11C 11/44 |
| 9,595,970 | B1* | 3/2017 | Reohr .................. H03K 19/195 |
| 9,613,699 | B1* | 4/2017 | Reohr .................. G11C 11/44 |
| 9,646,682 | B1 | 5/2017 | Miller et al. |
| 9,653,153 | B2 | 5/2017 | Herr et al. |
| 9,656,682 | B2 | 5/2017 | Ahlemeier |
| 9,712,172 | B2 | 7/2017 | Shauck et al. |
| 9,761,305 | B2 | 9/2017 | Reohr et al. |
| 9,779,803 | B1 | 10/2017 | Konigsburg et al. |
| 9,812,192 | B1* | 11/2017 | Burnett .................. G11C 11/44 |
| 10,102,902 | B2 | 10/2018 | Burnett et al. |
| 10,417,136 | B2 | 9/2019 | Horner et al. |
| 10,447,278 | B1* | 10/2019 | Reohr .................. G06N 10/00 |
| 2002/0084453 | A1 | 7/2002 | Bozovic |
| 2005/0047245 | A1 | 3/2005 | Furuta et al. |
| 2006/0171190 | A1 | 8/2006 | Kawasumi |
| 2006/0255987 | A1 | 11/2006 | Nagasawa et al. |
| 2008/0048902 | A1 | 2/2008 | Rylov et al. |
| 2008/0175086 | A1 | 7/2008 | Luk et al. |
| 2009/0075825 | A1 | 3/2009 | Rose et al. |
| 2009/0244958 | A1 | 10/2009 | Bulzacchelli et al. |
| 2009/0303807 | A1 | 12/2009 | Lee |
| 2010/0110803 | A1 | 5/2010 | Arai |
| 2011/0122675 | A1 | 5/2011 | Parkinson |
| 2011/0267878 | A1 | 11/2011 | Herr et al. |
| 2012/0108434 | A1 | 5/2012 | Bulzacchelli et al. |
| 2012/0120719 | A1 | 5/2012 | Worledge |
| 2012/0184445 | A1 | 7/2012 | Mukhanov et al. |
| 2015/0042373 | A1 | 2/2015 | Nakamura |
| 2015/0043273 | A1 | 2/2015 | Naaman et al. |
| 2015/0188337 | A1 | 7/2015 | Dewa et al. |
| 2016/0013791 | A1 | 1/2016 | Herr et al. |
| 2018/0025775 | A1* | 1/2018 | Ambrose ............... G11C 11/44 257/35 |
| 2020/0028512 | A1 | 1/2020 | Reohr et al. |
| 2020/0075093 | A1 | 3/2020 | Naaman |

FOREIGN PATENT DOCUMENTS

| | | |
|---|---|---|
| JP | 2013529380 A | 7/2013 |
| JP | 2015525426 | 9/2015 |
| KR | 20150024348 A | 3/2015 |
| KR | 101801901 B1 | 11/2017 |
| WO | 2013180946 A1 | 12/2013 |
| WO | 2015050621 A1 | 4/2015 |
| WO | 2016007136 A1 | 1/2016 |
| WO | 2016140889 A1 | 9/2016 |
| WO | 2016/0183213 A1 | 11/2016 |
| WO | 2016183213 A1 | 11/2016 |
| WO | 2017091258 A1 | 6/2017 |
| WO | 2018044562 A2 | 3/2018 |

OTHER PUBLICATIONS

Ryazanov, et al: "Magnetic Josephson Junction Technology for Digital and Memory Applications"; Physics Procedia, vol. 36, 2012, pp. 35-41; found on the internet at: https://ac.els-cdn.com/S1875389212020639/1-s2.0-S1875389212020639-main.pdf?_tid=a1a93085-a2e8-40ff-a8fa-65b19483b626&acdnat=1531313726_d791c05385184f2df22a2ed34b3450f9 (Jul. 11, 2018).

Vernik, et al.: "Magnetic Josephson Junctions with Superconducting Interlayer for Cryogenic Memory"; IEEE Transactions on Applied Superconductivity ( vol. 23, Issue: 3, Jun. 2013 ); found on the internet at: https://arxiv.org/ftp/arxiv/papers/1212/1212.0815.pdf; Jul. 11, 2018.

Australian Examination Report for Application No. 2017321215 dated Oct. 22, 2019.

European Office Action for Application No. 16 711 444.6-1203 dated Nov. 14, 2019.

Burm Baek et al: "Hybrid superconducting-magnetic memory device using competing order parameters", Nature Communications, vol. 5, May 25, 2014 (May 28, 2014), XP055276805, DOI: 10.1038/ncomms4888.

Japanese Office Action for Application No. 2018-108539 dated Feb. 20, 2020.

Korean Office Action for Application No. 10-2018-7034383 dated Feb. 19, 2020.

Australian Examination Report for Application No. 2018228493 dated Mar. 26, 2020.

(56) References Cited

OTHER PUBLICATIONS

Non-Final Office Action for U.S. Appl. No. 16/133,305, dated Mar. 13, 2020.
Canadian Examination Search Report for Application No. 3035211 dated Dec. 17, 2019.
Non Final Office Action for U.S. Appl. No. 16/256,547 dated Apr. 29, 2020.

* cited by examiner

JTL-BASED SUPERCONDUCTING LOGIC ARRAYS AND FPGAS

GOVERNMENT INTEREST

The invention was made under Contract Number W911NF-14-C-0115. The U.S. Government has rights to the invention as specified in that contract.

RELATED APPLICATIONS

This application claims priority from U.S. patent application Ser. No. 16/037,587, filed 17 Jul. 2018, which is incorporated herein in its entirety.

TECHNICAL FIELD

The present invention relates generally to quantum and classical digital superconducting circuits, and specifically to Josephson-transmission-line-based superconducting logic arrays and field-programmable gate arrays (FPGAs).

BACKGROUND

In the field of digital logic, extensive use is made of well-known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor-based single flux quantum circuitry, utilizing superconducting Josephson junctions, with typical signal power of around four nanowatts, at a typical data rate of twenty gigabits per second, or greater, and operating temperatures of around four kelvins.

A field-programmable gate array (FPGA) is an integrated circuit designed to be configured, after manufacturing, to produce one or more customized logic output functions. An FPGA can contain an array of programmable logic blocks and, in some cases, a hierarchy of reconfigurable interconnects between logic blocks. The logic blocks can include memory elements. High performance computing (HPC) systems use FPGAs to accelerate computation per unit of expended energy. FPGAs have conventionally been fabricated as CMOS devices.

SUMMARY

One example includes a superconducting reciprocal quantum logic (RQL) cell circuit having a decision loop configured to store a digital state and to readout an RQL-compliant logical output signal based on the digital state, an RQL-compliant read selection signal, and an RQL-compliant read data signal. The decision loop includes a magnetic Josephson junction (MJJ) configured to set the digital state as one of a first logic state and a second logic state based on write signals provided on write inputs. The decision loop further includes a secondary inductor of a selection input transformer through which the read selection signal is provided to the decision loop from a read selection Josephson transmission line (JTL). The decision loop further includes an escape Josephson junction (JJ) configured to trigger or not to trigger so as to block the read data signal from propagating to an output JTL or to act as a superconducting short to pass the read data signal to the output JTL, respectively, based on bias conditions established by the digital state and the read selection signal.

Another example includes a JTL-based superconducting logic array (JTLBSLA) circuit. The JTLBSLA circuit includes a plurality of mask-programmed and/or software-programmable logic cells arranged in an array of a plurality of rows, numbering M, and a plurality of columns, numbering N. Each software-programmable logic cell is configured to store a programmable digital state in a superconducting loop and to set the programmable digital state to one of a first logic state and a second logic state at operation time. Each mask-programmed logic cell functions as having a hard-coded digital state that is not changeable at operation time. The JTLBSLA circuit further includes a plurality of JTL-based selection lines, numbering M, configured to each provide a selection binary value as input to each of N cells in a corresponding row, and a plurality of JTL-based data lines, numbering N, configured to each provide a data binary value as input to a first cell in a corresponding column. Each cell in the array other than the last cell in each column provides an output as input to a next cell in a corresponding column or to an RQL gate, and the last cell in each column provides an array output representative of an evaluation of a generalized logic function.

Yet another example includes a JTL-based superconducting field-programmable gate array (JTLBSFPGA). The JTLBSFPGA includes at least first and second JTLBSLAs, each of which includes a plurality of software-programmable logic cells arranged in an array of a plurality of rows and a plurality of columns. Each software-programmable logic cell is configured to store a programmable digital state in a superconducting loop and to set the programmable digital state to one of a first logic state and a second logic state at operation time. Each of the first and second JTLBSLAs further includes a plurality of JTL-based selection lines configured to each provide a selection binary value as input to each of the cells in a corresponding row, and a plurality of JTL-based data lines configured to each provide a data binary value as input to a first cell in a corresponding column. Each cell in each of the first and second JTLBSLAs other than the last cell in each JTLBSLA column provides an output as input to a next cell in a corresponding JTLBSLA column or to an RQL gate. The last cell in each column provides an array output representative of an evaluation of a generalized logic function. Each array output of the first JTLBSLA, corresponding to an evaluation of a sum-of-products logic function, is provided to a corresponding selection line input of the second JTLBSLA, such that the JTLBSFPGA outputs a plurality of evaluations of generalized logic functions.

DETAILED DESCRIPTION

This disclosure relates generally to quantum and classical digital superconducting circuits, and specifically to Josephson-transmission-line-based superconducting logic arrays (JTLBSLAs). Reciprocal quantum logic (RQL) utilizes reciprocal data encoding in which logic operations are completed using positive pulses, while the internal state is erased using corresponding negative pulses that come half a clock cycle later, to produce combinational logic behavior. Examples of RQL logic operations are disclosed in U.S. Pat. Nos. 7,724,020 and 7,977,964, both entitled "Single Flux Quantum Circuits," the entire contents of both being incorporated by reference herein.

A JTLBSLA, as described herein, is an array of logic cells that are interconnected to realize specialized or generalized logic functions, and which is compatible with RQL circuits and systems. A JTLBSLA can include mask-programmed logic cells and/or software-programmable logic cells. A plurality of JTLBSLAs can be integrated with a plurality of hybrid Josephson transmission line (JTL) random-access memories (RAMs) to form JTL-based superconducting field programmable gate arrays (JTLBSFPGAs). JTLBSFPGAs can have tremendous speed and energy-consumption advantages over CMOS FPGAs.

A JTLBSLA can consist of a plurality of logic cells, each of which can be either mask-programmed or software-programmable. The logic function of a JTLBSLA or portions of such an array that consists of mask-programmed logic cells is hard-coded. The logic function of a mask-programmed logic array or array portion is written into a die or chip during fabrication by one or more masks customized to realize the intended function. In contrast, the logic function of a software-programmable logic array or array portion can be altered at any time by using control signals to write to software-programmable logic cells in the array or array portion.

A JTLBSFPGA, as described herein as made of a plurality of JTLBSLAs, can be software-programmable. At the cost of increased programming complexity (i.e., at implementation time), JTLBSFPGAs enable a programmer to implement complex algorithms in hardware directly during program run time. Although the underlying technologies are fundamentally different, JTLBSFPGAs can provide many of the core capabilities found in CMOS FPGAs. JTLBSFPGAs can provide more area efficiency when implementing larger functional compositions (i.e., can have many more Boolean terms) than what look-up tables (LUTs) implement in CMOS FPGAs. CMOS FPGAs industry-standard LUTs typically offer four-input logic functions. JTLBSFPGAs can also run at frequencies that are more than a factor of ten greater than what is possible with CMOS FPGAs.

Figure 1:
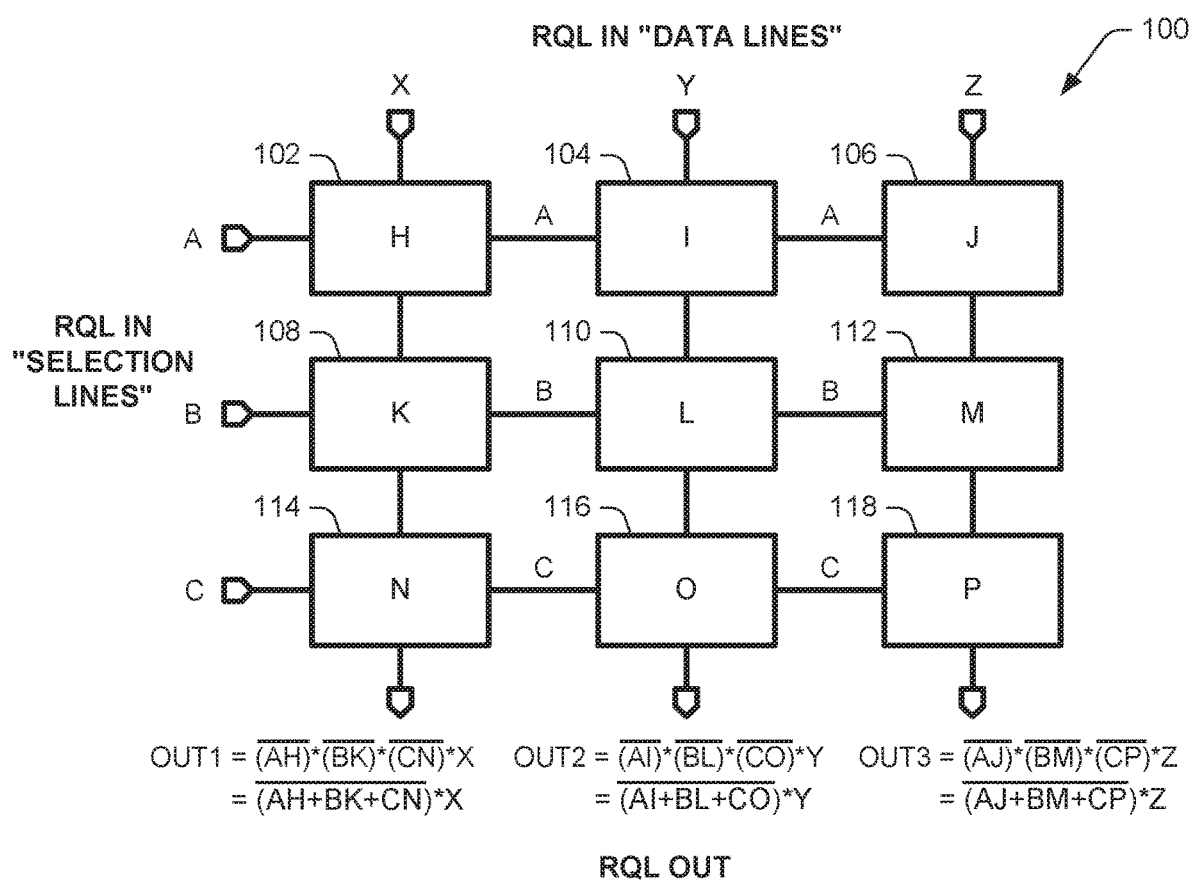
FIG. 1 is a block diagram of an example Josephson-transmission-line-based superconducting logic array (JTLBSLA).

FIG. 1 depicts an example JTLBSLA 100 that can be software-programmable or mask programmable to realize a generalized or specialized logic function. The illustrated example JTLBSLA 100 includes a 3×3 array of individual logic cells 102, 104, 106, 108, 110, 112, 114, 116, 118. Other examples may have smaller or larger number of cells and the array need not have the same number of columns as rows of cells. FIG. 1 defines the logic capability for the illustrated JTLBSLA 100, illustrating the read path (i.e., the read ports) only. RQL-compliant input signals A, B, C (e.g., positive or negative single flux quantum (SFQ) pulses) and RQL-compliant input signals X, Y, Z drive what might be referred to in a memory array context as word lines and bit lines, respectively. The word lines are shown as running horizontally in FIG. 1 and each individual word line transmits the same signal to every cell in a row. The bit lines are shown as running vertically in FIG. 1, however, unlike with the word lines, the signal received by any cell below the top-row cells is potentially modified by the action of any previous cell above it, as is made clearer in view of FIGS. 2-4, 8, and 9. The states H, I, J, K, L, M, N, O, P of the respective logic cells can be written into the cells via write-port word and bit line circuits (not shown in FIG. 1). Each state can be, for example, a binary logic state that can be written independently of the state of each other cell, or can be written in conjunction with the states of other cells. For example, the write port circuits (not shown) can be configured to write states of multiple logic cells along either a column or a row, or can target an individual logic cell in JTLBSLA 100.

RQL-compliant outputs OUT1, OUT2, OUT3 of JTLBSLA 100 are derived from the inputs and written cell states according to the following equations:

$$OUT1 = \overline{(AH)} * \overline{(BK)} * \overline{(CN)} * X = \overline{(AH + BK + CN)} * X$$

$$OUT2 = \overline{(AI)} * \overline{(BL)} * \overline{(CO)} * Y = \overline{(AI + BL + CO)} * Y$$

$$OUT3 = \overline{(AJ)} * \overline{(BM)} * \overline{(CP)} * Z = \overline{(AJ + BM + CP)} * Z$$

where overline indicates Boolean negation and parentheses indicate operation precedence.

For software-programmable-logic-array applications, the logic cell states (H through P in the illustrated example of FIG. 1) control what inputs (A through C and X through Z in the illustrated example) appear at the outputs (1 through 3 in the illustrated example). Thus, as may be noted with reference to the above output equations, output OUT1 can present input X as modified based on inputs A, B, and C and states H, K, and N; output OUT2 can present input Y as modified based on inputs A, B, and C and states I, L, and O; and output OUT3 can present input Z as modified based on inputs A, B, and C and states J, M, and P.

All inputs are exposed to utilize their full logic capability. Thus, what might have been, in a memory array context, only word selection line signals A, B, C, can process any set of RQL signals in a JTLBSLA context. In a memory array context, when a read is enabled, word lines are designated to receive one high signal (i.e., logical "1") and two low signals (i.e., logical "0"). As well, signals X, Y, Z can process any RQL signal at any time in a JTLBSLA context, whereas in a memory array context, they can only receive a high signal (i.e., logical "1") when read is enabled. In other words, X, Y, Z signals in a memory array context only assist in the detection of the state of a memory cell. As shown in FIG. 1, there is not a "wide OR" being done down the read bitline in the JTLBSLAs of the present disclosure. Instead, a signal injected at X, Y, or Z is conditionally propagated through the array, potentially being blocked at each cell by a combination of the "1" in that cell's state and a "1" in the corresponding RQL selection line.

Figure 2:
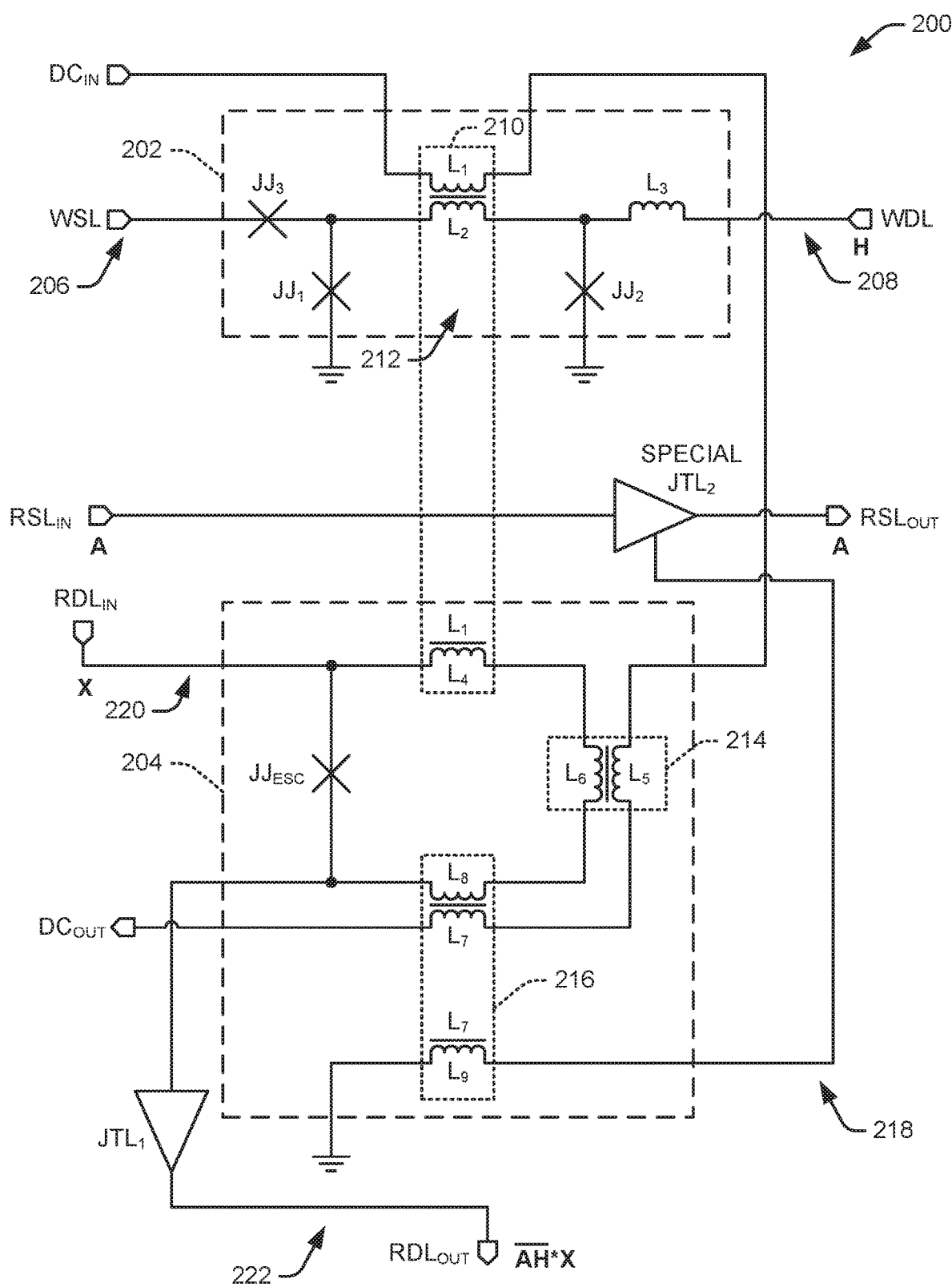
FIG. 2 is a circuit diagram of an example JTLBSLA logic cell with a Josephson-junction-based software-programmable logic state.

FIG. 2 illustrates an example superconducting state-writable logic cell circuit 200. As an example, the superconducting state-writable logic cell circuit 200 can be implemented in a JTLBSLA, such that the superconducting state-writable logic cell circuit 200 can correspond to a logic cell in the JTLBSLA. For example, circuit 200 can correspond to, or form part of, any of logic cells 102, 104, 106, 108, 110, 112, 114, 116, 118 in JTLBSLA 100 in FIG. 1.

Figure 9:
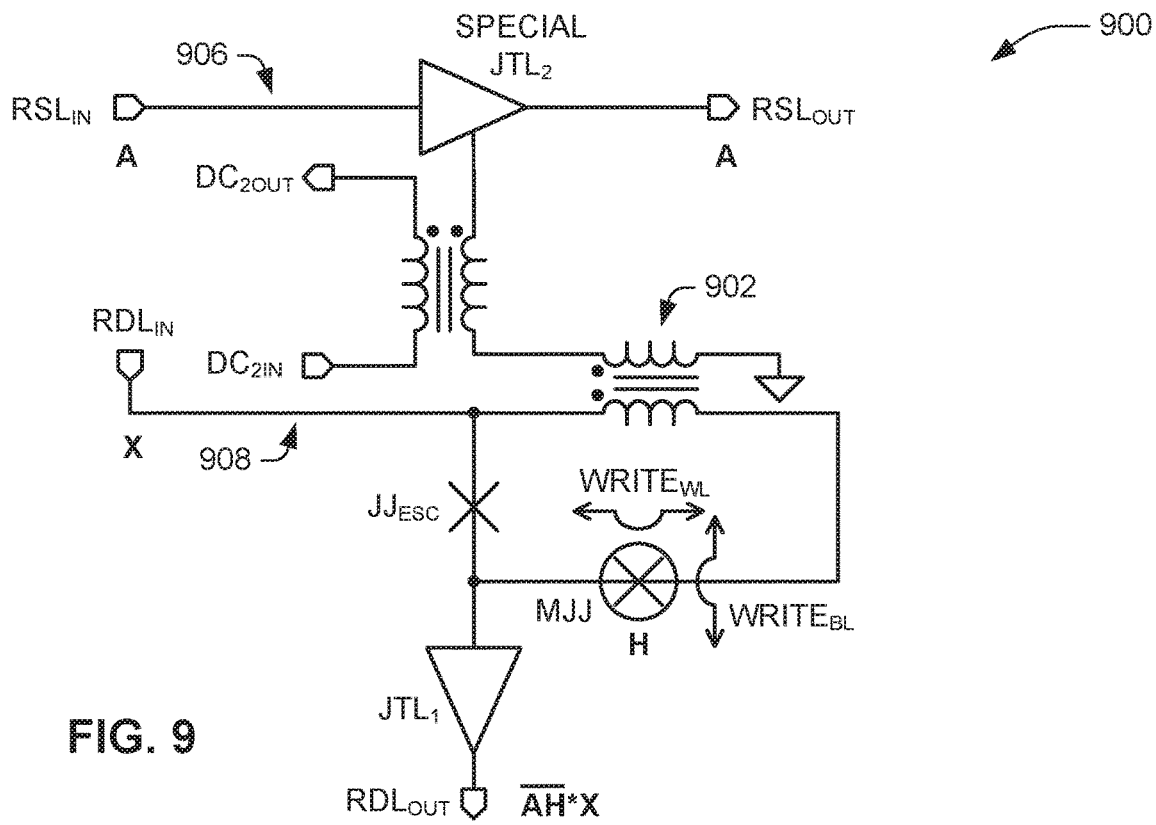
FIG. 9 is a circuit diagram of another example JTLBSLA logic cell with a magnetic-Josephson-junction-based software-programmable logic state.

The superconducting state-writable logic cell circuit 200 can be referred to as a Josephson-junction-based (JJ-based) cell, in contrast to the more compact, magnetic-Josephson-junction-based (MJJ-based) cells 800 and 900 of FIG. 9. Cell circuit 200 includes a Josephson D-gate circuit 202 and a decision loop 204. The D gate 202 might also be termed a state write circuit, while the decision loop 204 might be termed a read circuit. Decision loop 204 can also be termed a logic evaluation loop. The Josephson D-gate circuit 202 includes a write selection input 206 on which is provided write selection signal WSL and a write data input 208 on which is provided write data signal WDL. Both inputs are RQL-compatible and receive their inputs via JTLs. The Josephson D-gate circuit 202 also includes a bias transformer 210 that includes a primary inductor $L_1$ and a secondary inductor $L_2$. A bias current $DC_{IN}$ is provided through the primary inductor $L_1$ to induce a bias current in the secondary inductor $L_2$. The Josephson D-gate circuit 202 also includes a bi-stable loop 212 that is formed by a first Josephson junction $JJ_1$, a second Josephson junction $JJ_2$, and the secondary inductor $L_2$. The Josephson D-gate circuit 202 also includes a third Josephson junction $JJ_3$ interconnecting the write selection input 206 and the bi-stable loop 212, and an inductor $L_3$ interconnecting the write data input 208 and the bi-stable loop 212.

The decision loop 204 includes a first loop transformer 214 that includes a primary inductor $L_5$ and a secondary inductor $L_6$, and a second loop transformer 216 that includes a primary inductor $L_7$ and a secondary inductor $L_8$. The bias current $DC_{IN}$ is provided through the primary inductors $L_5$ and $L_7$ to induce a loop current in the respective secondary inductors $L_6$ and $L_8$. In addition, in the example logic cell circuit 200 of FIG. 2, the bias transformer 210 also includes a tertiary inductor $L_4$ that is likewise inductively coupled to the primary inductor $L_1$ and the secondary inductor $L_2$. Therefore, the loop current likewise flows through the tertiary inductor $L_4$ in response to the bias current $DC_{IN}$ flowing through the primary inductor $L_1$ in the Josephson D-gate circuit 202. The decision loop 204 also includes an escape Josephson junction $JJ_{ESC}$ that is arranged in series with the tertiary inductor $L_4$ and the secondary inductors $L_6$ and $L_8$. Therefore, the decision loop 204 is arranged as a superconducting loop around which the loop current flows.

The decision loop 204 also includes a read selection input 218 on which the read selection signal $RSL_{IN}$ is provided via Special $JTL_2$, which is discussed in greater detail later with respect to FIGS. 3 and 4, but which for the moment can be considered as an RQL signal splitter. The read selection signal $RSL_{IN}$ is provided through a tertiary inductor $L_9$ that is likewise inductively coupled to the primary inductor $L_7$ and the secondary inductor $L_8$. As an example, the tertiary inductor $L_9$ can be wound or otherwise fabricated with respect to the primary and secondary inductors $L_7$ and $L_8$ such that the read selection signal $RSL_{IN}$ provided on read selection input 218 can induce current in an opposite direction relative to the bias current $DC_{IN}$. In addition, the decision loop 204 also includes a read data input 220 on which the read data signal $RDL_{IN}$ is provided, and an output 222 on which the output signal $RDL_{OUT}$ is provided, e.g., to the next logic cell in the column of the array (e.g., as shown in FIG. 1) via Josephson transmission line $JTL_1$, which can isolate cell 200 from the next cell in the column and can amplify the output signal $RDL_{OUT}$ as may be required to drive circuitry in the next cell. The escape Josephson junction $JJ_{ESC}$ interconnects the read data input 220 and the output 222, such that the output signal $RDL_{OUT}$ can be provided as one of an SFQ pulse or no SFQ pulse at the output 222 in response to no triggering or triggering of the escape Josephson junction $JJ_{ESC}$ based on the amplitude of the loop current.

As used herein, the term "amplitude of the loop current" with respect to the loop current describes an amplitude of the loop current in a given one direction of current flow, as opposed to an absolute value of the amplitude of the loop current, and thus irrespective of current direction. Therefore, the loop current can have a first amplitude corresponding to a positive amplitude (e.g., clockwise), such as corresponding to the digital state having the first logic state (e.g., logical "0"), as described in greater detail herein. The loop current can also have an amplitude that is less than the first amplitude, but is still positive (e.g., still clockwise), such as based on a current component being induced in the loop via the read selection SFQ pulse $RSL_{IN}$ while the decision loop 204 stores the first logic state. The loop current can also have an amplitude that is approximately zero (e.g., slightly positive or slightly negative), such as corresponding to the digital state having the second logic state (e.g., logical "1"). Additionally, the loop current can have an amplitude that is negative (e.g., counter-clockwise), such as based on the current component being induced via the read selection SFQ pulse $RSL_{IN}$ while the decision loop 204 stores the second logic state. The possible amplitudes described herein are provided by example, such that the loop current can have a broad variety of amplitudes that can correspond to a respective variety of conditions associated with the digital state and/or the data write and data read operations, with none or some of the amplitudes corresponding to different current directions in the decision loop 204. Therefore, in a quiescent state in each of the first and second logic states of the stored digital state, the loop current has a different amplitude, which may or may not correspond to different current directions.

Logic cell circuit 200 of FIG. 2 thus provides, for example, a superconducting logic circuit including a Josephson D-gate circuit 202 and a decision loop 204 coupled to the D-gate circuit 202, wherein the D-gate circuit 202 is configured to set a digital state as one of a first logic state and a second logic state in response to a write selection single flux quantum (SFQ) pulse WSL provided on a write selection input 206 and a respective presence of or absence of a write data SFQ pulse WDL provided on a data write input 208, and wherein the decision loop is configured to store the digital state and to readout an RQL-compliant logical output signal at an output 222, the logical output signal being based on the digital state, a read selection SFQ pulse $RSL_{IN}$ provided on a read selection input 218, and a read data SFQ pulse $RDL_{IN}$ provided on a read data input 220. The decision loop 204 can be configured to conduct a loop current having an amplitude that is set by the Josephson D-gate circuit 202, the decision loop 204 including an escape Josephson junction $JJ_{ESC}$ that is configured to trigger or not trigger in response to the read selection SFQ pulse $RSL_{IN}$ and the read data SFQ pulse $RDL_{IN}$ to indicate the respective first logic state or second logic state at the output 222 based on an amplitude of the loop current.

The Josephson D gate 202 can include a first Josephson junction $JJ_1$ associated with the write selection input 206 and a second Josephson junction $JJ_2$ associated with the write data input 208, wherein the digital state corresponds to a superconducting phase associated with the first Josephson junction. The Josephson D-gate circuit 202 can be configured to set the digital state from the first logic state to the second logic state based on setting the first Josephson junction $JJ_1$ to a $2\pi$-state in response to the write selection SFQ pulse and the write data SFQ pulse, the $2\pi$-state of the first Josephson junction $JJ_1$ providing the superconducting phase at a non-zero amplitude that is inductively coupled to the decision loop 204 to set the amplitude of the loop current to correspond to the second logic state.

The Josephson D-gate circuit 202 can further include a bias transformer, 210 the bias transformer including a primary inductor $L_1$ configured to conduct a bias current and a secondary inductor $L_2$ interconnecting the first and second Josephson junctions $JJ_1$, $JJ_2$ and being configured to conduct an induced bias current in the first and second Josephson junctions $JJ_1$, $JJ_2$ in response to the bias current, wherein the decision loop 204 includes a tertiary inductor $L_4$ associated with the bias transformer 210 that is configured to inductively couple the superconducting phase into the decision loop 204 to affect the amplitude of the loop current.

The decision loop 204 can include at least one loop transformer 214, 216 each of the at least one loop transformer including a primary inductor $L_5$, $L_7$ configured to conduct a bias current $DC_{IN}$, a secondary inductor $L_6$, $L_8$ in series with the escape Josephson junction $JJ_{ESC}$ and being configured to induce the loop current, such that the loop current has a first amplitude corresponding to the first logic state, and a second amplitude that is set by the Josephson D-gate circuit 202 corresponding to the second logic state. One 216 of the at least one loop transformer can further include a tertiary inductor $L_9$ that is inductively coupled to the primary inductor $L_7$ associated with the respective at least one loop transformer 216, the tertiary inductor $L_9$ being configured to conduct the read selection SFQ pulse $RSL_{IN}$ to change the amplitude of the loop current to bias the escape Josephson junction $JJ_{ESC}$. The decision loop 204 is configured to receive the read data SFQ pulse $RSL_{IN}$ to trigger the escape Josephson junction $JJ_{ESC}$ in response to the loop current having the second amplitude, or to not trigger the escape Josephson junction in response to the loop current having the first amplitude. The second amplitude of the loop current can be approximately equal to the first amplitude of the loop current minus an induced current component corresponding to a superconducting phase of at least one Josephson junction associated with the Josephson D-gate circuit 202 that that is induced in the decision loop 204.

Logic cell circuit 200 can further include one or more of a first Josephson transmission line (JTL) interconnect (not shown) that couples a word-write line to the write selection input 206 to provide the write selection SFQ pulse WSL based on a word-write signal that propagates on the word-write line, a second JTL interconnect (not shown) that couples a bit-write line to the write data input 208 to provide the write data SFQ pulse WDL based on a bit-write signal that propagates on the bit-write line, a third JTL interconnect special $JTL_2$ that couples a word-read line to the read selection input 218 to provide the read selection SFQ pulse $RSL_{IN}$ based on a word-read signal that propagates on the word-read line, a fourth JTL interconnect (not shown) that couples a bit-read line to the read data input 220 to provide the read data SFQ pulse $RDL_{IN}$ based on a bit-read signal that propagates on the bit-read line, and a fifth JTL interconnect $JTL_1$ that couples the decision loop 204 to the output 222 to provide an output SFQ pulse $RDL_{OUT}$.

Arranged as shown in FIG. 1, a plurality of cell circuits 200 provides a superconducting logic array circuit including a plurality of logic cells 200 arranged in an array of a plurality of rows and a plurality of columns. Cell circuit 200 can output a computed logic result by storing the digital state as one of a first logic state and a second logic state via the Josephson D-gate circuit 202 to conduct a loop current associated with the decision loop 204 comprising an escape Josephson junction $JJ_{ESC}$ and an output 222, the loop current having an amplitude that is based on the digital state, providing a read selection SFQ pulse $RSL_{IN}$ on a read selection input 218 to bias the escape Josephson junction $JJ_{ESC}$, and providing a read data SFQ pulse $RDL_{IN}$ on a read data input 220 to trigger or not trigger the escape Josephson junction $JJ_{ESC}$ in response to the read data SFQ pulse $RDL_{IN}$ to indicate the respective first logic state or second logic state at the output 222 based on the amplitude of the loop current.

A bias current can be provided to at least one loop transformer 214, 216, each of the at least one loop transformer 214, 216 comprising a primary inductor $L_5$, $L_7$ configured to conduct the bias current and a secondary inductor $L_6$, $L_8$ in series with the escape Josephson junction $JJ_{ESC}$ and being configured to induce the loop current, such that the loop current has a first amplitude corresponding to the first logic state, and a second amplitude that is set by the Josephson D-gate circuit 202 corresponding to the second logic state. Providing the read selection SFQ pulse can include providing the read selection SFQ pulse $RSL_{IN}$ to a tertiary inductor $L_9$ to change the amplitude of the loop current to bias the escape Josephson junction $JJ_{ESC}$. Providing the read data SFQ pulse $RDL_{IN}$ can include providing the read data SFQ pulse $RDL_{IN}$ to trigger the escape Josephson junction $JJ_{ESC}$ in response to the loop current having the second amplitude, or to not trigger the escape Josephson $JJ_{ESC}$ junction in response to the loop current having the first amplitude. The second amplitude of the loop current can be approximately equal to the first amplitude of the loop current minus an induced current component corresponding to a superconducting phase of at least one Josephson junction associated with the Josephson D-gate circuit 202 that that is induced in the decision loop 204.

To summarize the functioning of logic cell circuit 200, the D gate 202 can store a state H (corresponding, e.g., to any of the states H through P in FIG. 1) by coupling current through the $L_1/L_2$ transformer 210, and the direction of that current determines the logic cell's state H, i.e., whether the logic cell 200 stores a logical "1" or a logical "0." If the logic cell 200 stores a logical "1," it induces a counter-clockwise current in the decision loop 204. To perform a readout of the logic cell 200, a current can be sent through read selection input 218 (i.e., as read selection signal $RSL_{IN}$), which also induces counter-clockwise current into the decision loop 204. A positive SFQ pulse of current sent through read data input 220 (i.e., as read data signal $RDL_{IN}$) is either blocked or not blocked depending on whether the state H of the D gate 202 is a logical "1" or a logical "0" and whether the read has been enabled with the read selection signal $RSL_{IN}$ on read selection input 218.

In a normal quiescent state H (i.e., when D-gate circuit 202 is set to a state H of logical "0"), a pulse sent in on read data input 220 (as read data signal $RDL_{IN}$) passes right through the escape Josephson junction $JJ_{ESC}$, and thereby propagates through the circuit 200 as output signal $RDL_{OUT}$ on output line 222, because escape Josephson junction $JJ_{ESC}$ acts, in this quiescent state, as a superconducting short. However, if the D-gate circuit 202 is in a logical "1" state H and a read is enabled with read selection signal $RSL_{IN}$ provided on read selection input 218, sufficient counter-clockwise current is induced to heavily forward-bias the escape Josephson junction $JJ_{ESC}$, such that when a read pulse $RDL_{IN}$ comes in on read data input 220, the read pulse $RDL_{IN}$ triggers the escape Josephson junction $JJ_{ESC}$ and "captures" the read pulse $RDL_{IN}$, i.e., the read pulse $RDL_{IN}$ is not permitted to proceed to output 222 as an output signal $RDL_{OUT}$.

Thus, the read circuit 204 performs an "inverted read," in that if reading a logical "1," no pulse is observed on the output line 222 as output signal $RDL_{OUT}$, because a read data pulse $RDL_{IN}$ does not propagate through to output 222, whereas if reading a logical "0," the read data pulse $RDL_{IN}$ pulse propagates through to the output 222 as output signal $RDL_{OUT}$. An RQL inverter can be connected to output line 222 to invert the output signal $RDL_{OUT}$, but this is not strictly necessary, because the expectation of an inverted read can otherwise be built into the architecture of the JTLBSLA, JTLBSFPGA, or larger RQL system in which either of these is included.

Figure 3:
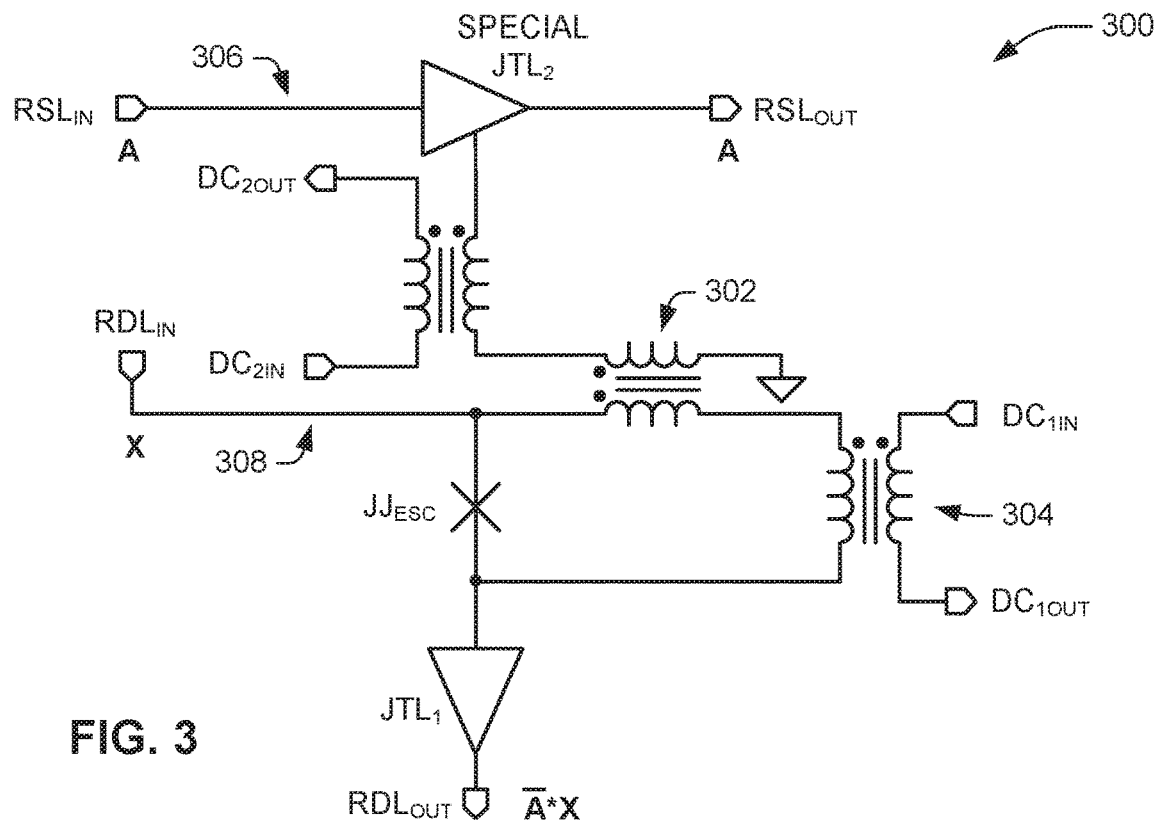
FIG. 3 is a circuit diagram of an example mask-programmable JTLBSLA logic cell that forces a cell state of logical "1."
Figure 4:
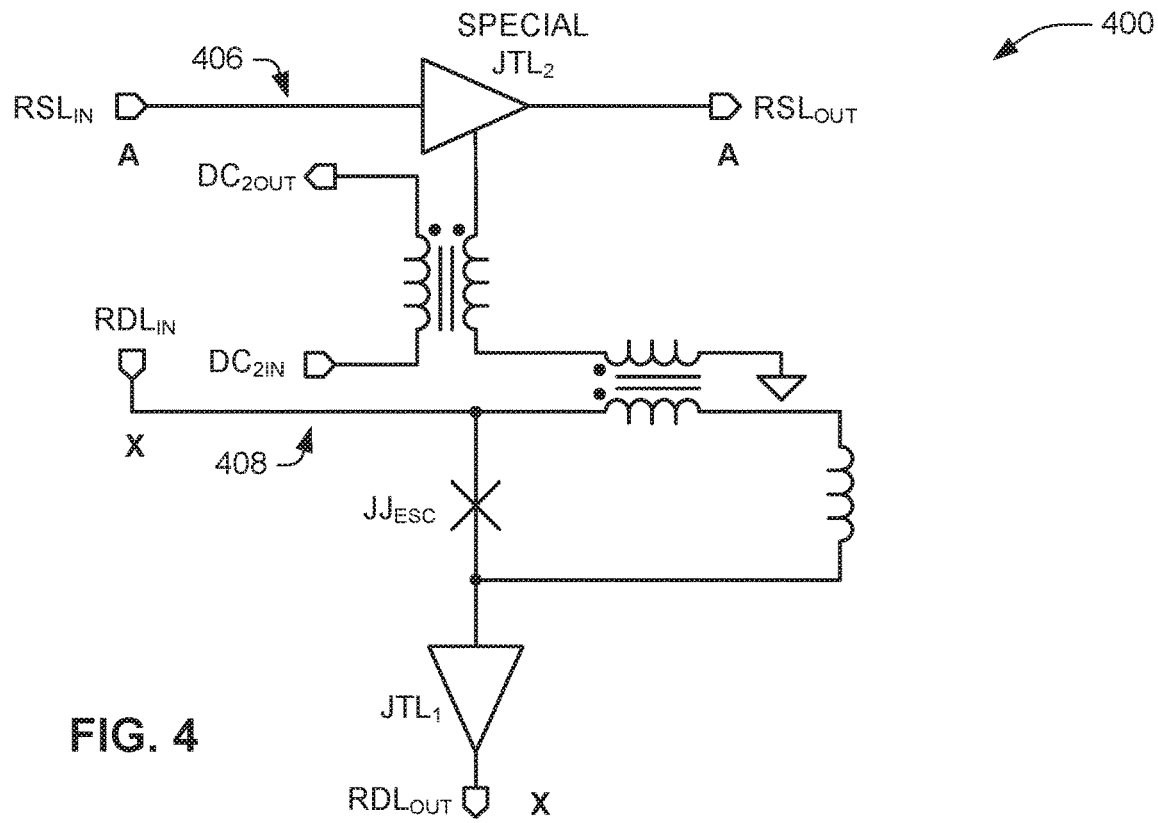
FIG. 4 is a circuit diagram of an example mask-programmable JTLBSLA logic cell that forces a cell state of logical "0."

FIGS. 3 and 4 illustrate example mask-programmed fixed-logic-state cell circuit topologies 300, 400 that provide a fixed logical "1" or "0," respectively. These cell circuits do not include state write circuitry comparable to the D gate 202 of JJ-based cell circuit 200 in FIG. 2 because their states are hard-coded. By using one of the cells 300 or 400 of FIG. 3 or 4 as a logic cell in the JTLBSLA 100 of FIG. 1, one or more state terms, H through P of FIG. 1, can permanently set the respective cell state at fabrication time as a logical "1" or a logical "0" to effectively "block" or "pass through" a cell input to a cell output.

The dots on the transformers in FIGS. 3 and 4 indicate the polarities of the transformers. Where, as here, the dots appear both on the same side of the transformer, current flowing from left to right through the primary (e.g., top) inductor will induce current flowing from right to left through the secondary (e.g., bottom) inductor of the transformer. In other words, the transformer dots indicate that the induced current flows in the opposite direction as the primary current.

Mask-programmable cell 300 of FIG. 3 functions as a logic AND cell, where escape Josephson junction $JJ_{ESC}$ serves as a readout junction. Logic circuit 300 functions somewhat similarly to the topology 200 of FIG. 2, in that circuit 300 likewise has a superconducting loop with a Josephson junction in series with a signal path, and by inducing current through that Josephson junction, the critical current of the Josephson junction can be effectively modulated to perform a logic function. Two transformers 302, 304 are coupled into the loop. The read selection line 306 biases the escape Josephson junction $JJ_{ESC}$. When read selection line 306 goes high, e.g., with the introduction of a positive SFQ pulse at port $RSL_{IN}$, a superconducting counter-clockwise current is induced, via transformer 302, into the loop that includes escape Josephson junction $JJ_{ESC}$. The external bias $DC_{1IN}$, provided to the loop via transformer 304, in effect forces a cell state of logical "1," and allows the circuit 300 to perform an AND function with the read data line 308 and the read selection line 306, as indicated at the bottom of FIG. 3.

Mask-programmable cell 400 of FIG. 4 functions as a pass-through cell. Compared to AND cell 300 of FIG. 3, cell 400 omits transformer 304, in the absence of which, the state of the read selection line 406 is made irrelevant since, the signal content of the read data line 408 will always be propagated to the output $RDL_{OUT}$, in effect forcing a cell state of logical "0." In spite of its relative complexity as compared to cell 700 shown in FIG. 7, cell 400 might be implemented for consistency of a layout or fabrication process, wherein it may be advantageous to copy similar cells repeatedly in an array. The presence or absence of a single transformer alters the performance of the particular cell. The performance of cell 400 is identical to that of cell 300 when no flux is introduced on DC bias line $DC_{1IN}$. Thus, using the topology of cell 300 for multiple cells and connecting multiple DC bias lines to different cells, the performance of any individual cell or set of cells all connected to the same bias line can be changed from an AND function to a pass-through function simply by toggling the DC bias current on and off.

In each of cell circuits 300 and 400, the current induced into the loop by DC bias $DC_{1IN}$ can be, for example, between ¼ $\Phi_0$ and ½ $\Phi_0$. Also, in each of cell circuits 300 and 400, additional DC bias line $DC_{2IN}$ can provide fine-tuning of circuit performance. For example, DC bias lines can be tuned so that when incoming selection signal $RSL_{IN}$ is "high," a significant portion (e.g., between about fifty and about ninety percent) of the critical current of Josephson junction is contributed by the selection line signal and the DC bias lines $DC_{1IN}$ and $DC_{2IN}$. As an example, if escape Josephson junction $JJ_{ESC}$ inside the loop has a critical current of 100 µA, the combined contributions of $RSL_{IN}$, $DC_{1IN}$, and $DC_{2IN}$, when "on," can total to provide between about 80 and 90 µA flowing counter-clockwise through the loop, such that additional read data line current coming from $RDL_{IN}$ suffices as the "nudge" to push escape Josephson junction $JJ_{ESC}$ to trigger, and when inputs $RSL_{IN}$, $DC_{1IN}$, and $DC_{2IN}$ are "off," approximately zero current flows through the loop and escape Josephson junction $JJ_{ESC}$. Accordingly, in the event that activated $RSL_{IN}$ and $DC_{1IN}$ signals do not by themselves suffice to place the loop current within the desired subcritical range, additional current can be supplied through tuning line $DC2_{IN}$ to place the loop current within the desired subcritical range. $DC2_{IN}$ can likewise be used to tune either of circuits 300 or 400 in the opposite direction. In the event that the process is "hotter" than desired, meaning that activated $RSL_{IN}$ and $DC1_{IN}$ signals combine to provide a supercritical current through the loop that includes escape Josephson junction $JJ_{ESC}$ (e.g., 110 µA), such that escape Josephson junction $JJ_{ESC}$ triggers "prematurely" (i.e., without a read data line input signal from $RDL_{IN}$), supplying a counteracting current on $DC_{2IN}$ can return the loop current to subthreshold. Thus, $DC_{2IN}$ can be used to supply fine tuning to cell circuits 300, 400 in any of several different ways.

Figure 5:
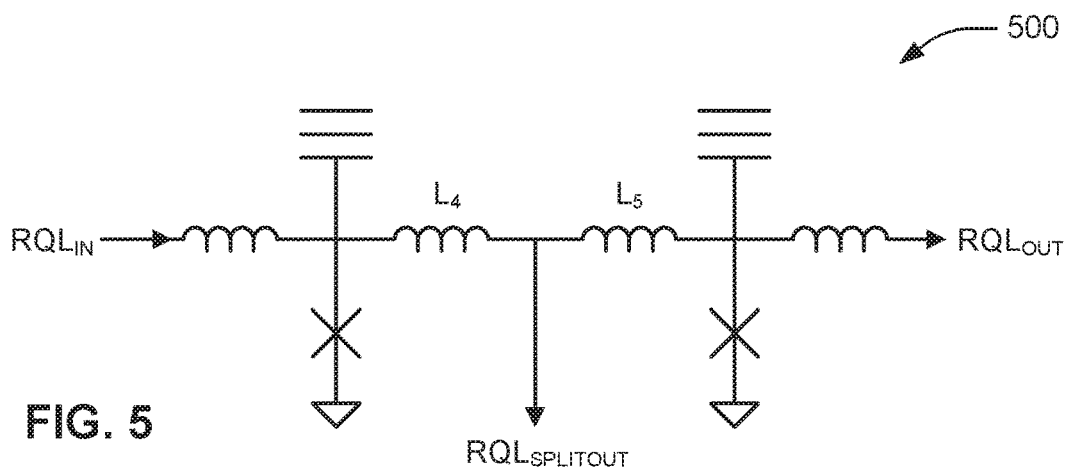
FIGS. 5 and 6 are circuit diagrams of example special Josephson transmission lines (JTLs) that can be used in JTLBSLA logic cells.
Figure 6:
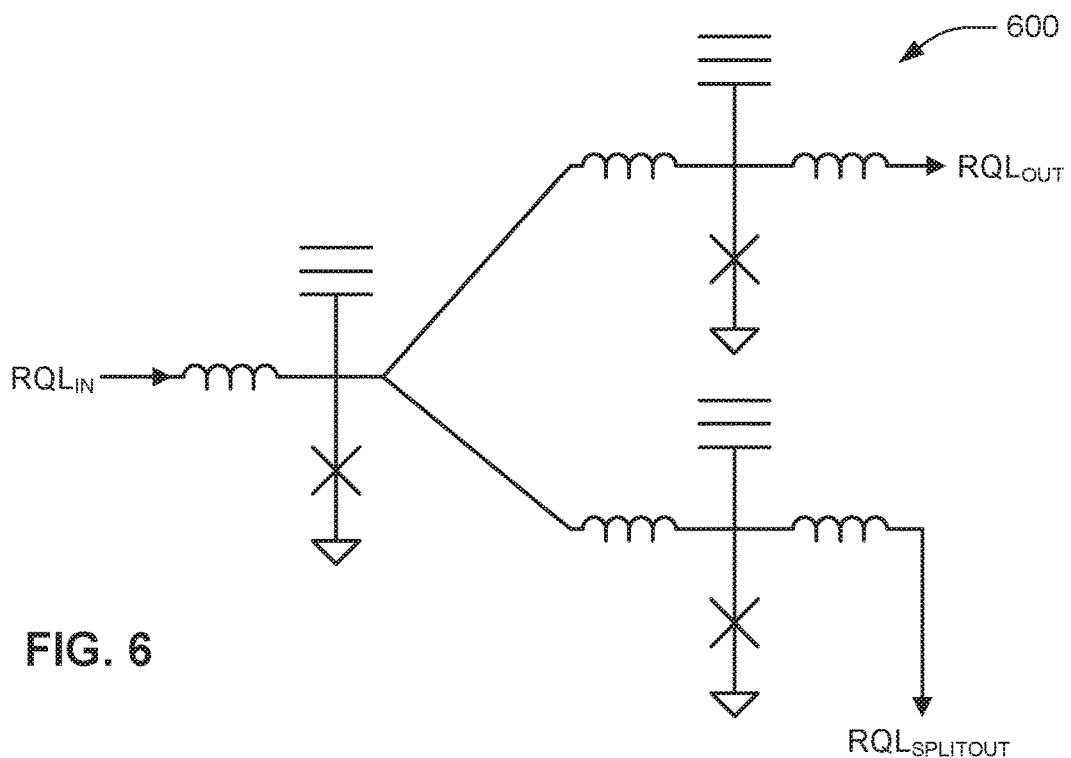

In each of cell circuits 200, 300, and 400, output Josephson transmission line $JTL_1$ near the bottom of respective drawings FIGS. 2, 3, and 4 can feed into another cell in the array of cells, such as is illustrated in FIG. 1. Special $JTL_2$ in circuits 200, 300, and 400 is a JTL that delivers the selection signal from the previous JTL into the respective transformer as sufficient current into the readout loop. Thus, whatever its particular structure, Special $JTL_2$ acts as a splitter to both pass an incoming read selection signal provided at $RSL_{IN}$ to the cell circuit 200, 300, or 400 and also to pass the selection signal on unaltered to the next cell in the row of cells in an array, such as the array 100 illustrated in FIG. 1. Special $JTL_2$ can be implemented in a variety of ways; two examples are illustrated in FIGS. 5 and 6. An output of Special $JTL_2$, $RSL_{OUT}$, can go on to another cell in the same row.

FIG. 5 shows an example tapped JTL circuit 500 that can be used as Special $JTL_2$. Circuit 500 shows a JTL or portion of a JTL that is tapped in between the $L_4$ and the $L_5$ inductors, i.e., in between two inductors connecting two Josephson junctions in the JTL, to provide an incoming SFQ pulse from input $RQL_{IN}$ to an output $RQL_{SPLITOUT}$ that can be passed to the logic cell circuit, while an output $RQL_{OUT}$ can provide the same incoming signal to a next cell in the row. Certain components, e.g., inductors, may have been omitted from JTL 500 for simplicity of illustration.

FIG. 6 shows an example splitter JTL circuit 600 that can be used as Special $JTL_2$. Circuit 600 shows a JTL or portion of a JTL that is split such that an incoming SFQ pulse from $RQL_{IN}$ can be provided both to an output $RQL_{SPLITOUT}$ that can be passed to the logic cell circuit and to an output $RQL_{OUT}$ can provide the same incoming signal to a next cell in the row. Certain components, e.g., inductors, may have been omitted from JTL 600 for simplicity of illustration. Where it is desirable for a special JTL to feed an input to more than two output branches, multiple circuits 600 of FIG. 6 can be concatenated into a tree such that an input is split, and split again and again as necessary to feed multiple cells.

Figure 7:
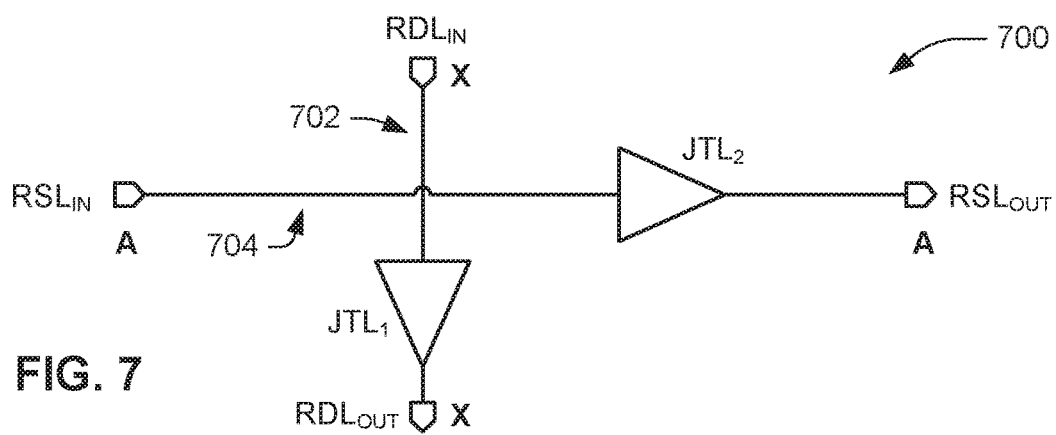
FIG. 7 is a circuit diagram of another example mask-programmable JTLBSLA logic cell that forces a cell state of logical "0."

Mask-programmable cell 700 of FIG. 7 serves as a pass-through cell, similar in function to cell 400 of FIG. 4, but with a circuit structure simpler than the circuit structure of cell 400. Cell circuit 700 includes only two superconducting lines 702, 704 as read selection and read data lines, each superconducting line having one of two JTLs, $JTL_1$ and $JTL_2$. The signal content of the read data line 702 is always propagated to the output $RDL_{OUT}$, in effect forcing a cell state of logical "0."

Figure 8:
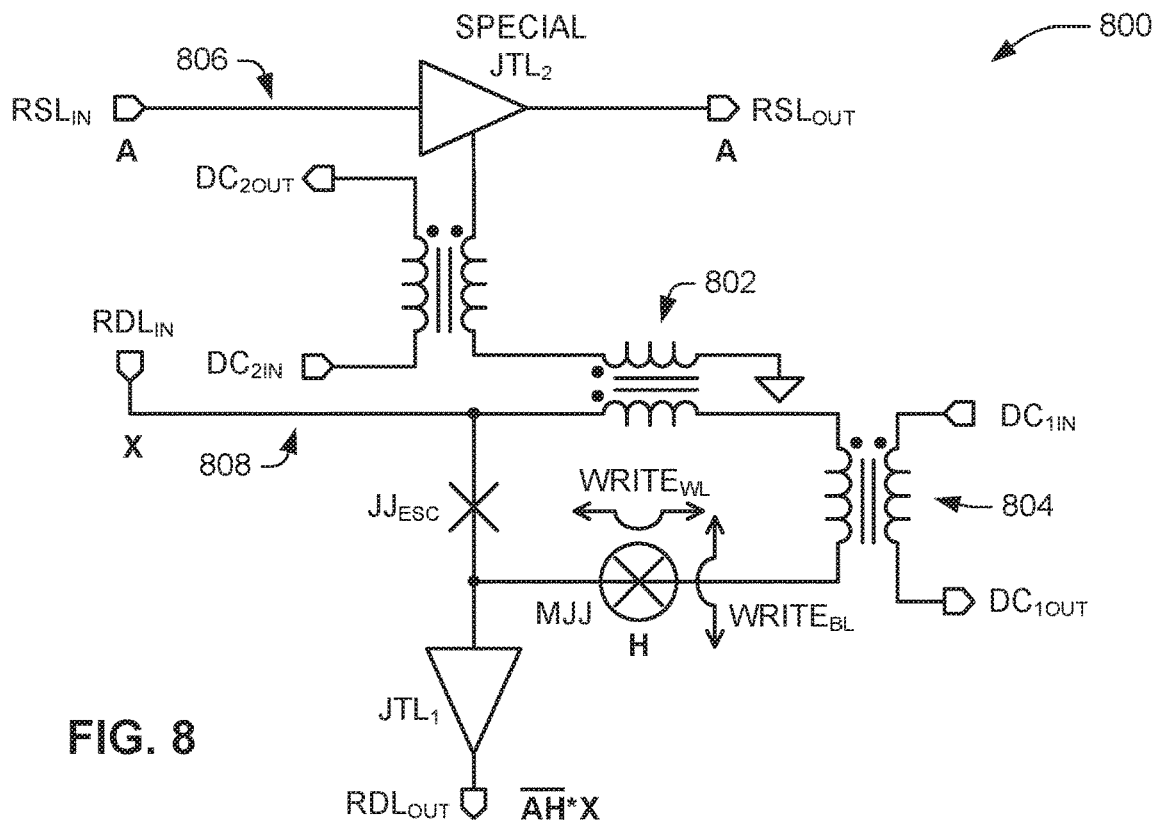
FIG. 8 is a circuit diagram of an example JTLBSLA logic cell with a magnetic-Josephson-junction-based software-programmable logic state.

FIG. 8 illustrates an example magnetic-Josephson-junction-based cell topology 800 that functions as a software-programmable RQL gate that is extremely compact. A single magnetic Josephson junction MJJ, serving as the state storage element, reduces cell size in comparison to the JTL-based cell 200 of FIG. 2. The single magnetic Josephson junction MJJ in cell 800 supplants RQL D gate 202 as well as four JTLs and their associated bias transformers (not shown in FIG. 2). Resultantly, the area of cell 800 of FIG. 8 can be, for example, less than half of the area of JTL-based cell 200 of FIG. 2. Like the cell 200 of FIG. 2, and more specifically its RQL D gate 202, the magnetic Josephson junction MJJ can be thought of as a flux source that introduces flux into the superconducting loop that includes escape Josephson junction $JJ_{ESC}$, magnetic Josephson junction MJJ, read transformer 802, and DC transformer 804. Specifically, magnetic Josephson junction MJJ introduces 0 or π phase change to the loop. A phase change of 0 corresponds to a logical "0," and the phase change π corresponds to a logical "1." Thus, when magnetic Josephson junction MJJ has been written to a logical "0" state, it puts out zero flux and behaves as a superconducting wire. When it has been written to a logical "1" by using certain coupled magnetic sources, it puts ½ Φ0 into the loop. In this configuration, the magnetic Josephson junction MJJ acts as phase shifter for the loop and never switches (moves into the voltage state) like the escape Josephson junction $JJ_{ESC}$.

During read operations, while in the π state and reading, the magnetic Josephson junction MJJ introduces a counter-clockwise current flow into the loop. Notably, the magnetic Josephson junction MJJ in cell circuits 800 and 900 is not being used to change the resistance of the element, but instead is used as a phase shifter.

For a read operation of cell circuit 800, an RQL pulse pair propagates along the read selection line 806 from input $RSL_{IN}$ to output $RSL_{OUT}$. Special $JTL_2$, which functions as previously described, and which can be realized in a variety of ways, including as illustrated in FIGS. 5 and 6, propagates the read selection RQL pulse pair from $RSL_{IN}$ to $RSL_{OUT}$ of each logic cell connected in series in a row of an array (e.g., array 100 of FIG. 1). Special $JTL_2$ "selects" its associated superconducting loop of the MJJ-based cell, i.e., excites the superconducting loop, and also drives a corresponding Special $JTL_2$ of the next cell in the array row. As discussed previously, logic cells may be connected in series to form a row of logic cells where the read selection line 806 of one drives the read selection line of the next cell. Cell 800 may be connected to logic cells of other types, or to more generic RQL logic, because its read inputs receive RQL signals, and its outputs generate RQL signals, making it fully RQL-compliant, just like the cell types shown in FIGS. 2-4 and 7.

In a read operation, the logic state H of magnetic Josephson junction MJJ is directly imposed within the superconducting loop. Under no-select conditions, the current in the loop flows clockwise, effectively deselecting the escape Josephson junction $JJ_{ESC}$. However, under full-select conditions, where magnetic Josephson junction MJJ is in the π state, and the read selection line 806 is pulsed, the current is reversed, forward-biasing the escape Josephson junction $JJ_{ESC}$ and stopping any pulses (i.e., interrogation pulses) from propagating further along the read data line 808. In the half-select case, where the magnetic Josephson junction MJJ is in the 0 state, and the read selection line 806 is pulsed, the current through the escape Josephson junction $JJ_{ESC}$ is still small enough to permit pulses to propagate even though the read selection line 806 is enabled.

For a write operation exploiting spin-valve writing of magnetic Josephson junction MJJ, one write word line driver and all write bit-line drivers source write currents through one selected word line and all the selected bit-lines. As shown in FIG. 8, the write bit line $WRITE_{BL}$ intersects the write word line $WRITE_{WL}$ at about a 90° orthogonal angle. The currents sent through the word and bit lines at similar times generate coincident and orthogonal magnetic fields that can change the magnetic Josephson junction MJJ state within a logic cell 800 to a new state. The word line field can drive all magnetic Josephson junctions of multiple logic cells along the same write word line $WRITE_{WL}$ into an active write state. All of these magnetic Josephson junctions must be driven, by either positive or negative bit line fields, to either π or 0 states, to respectively alter the state of a cell to a logical "1" or "0."

While the magnetic fields are being applied, the step of writing the magnetic Josephson junctions also involves the correct setting of the magnetic Josephson junctions into a positive π state, as described in U.S. Pat. No. 9,520,181, which is herein incorporated by reference. As shown in FIG. 8, a more compact magnetic-Josephson-junction-based cell can be realized by configuring $DC_{1IN}$ and DC transformer 804 to support different currents during a read operation versus during a write operation. For example, during a write operation, $DC_{1IN}$ can provide a first current that impels DC transformer 804 to generate a counter-clockwise current within the superconducting loop to drive magnetic Josephson junction MJJ into the positive π state. During a read operation, $DC_{1IN}$ can provide a second current that impels DC transformer 804 to generate a clockwise current within the superconducting loop to assure the correct logic according to the readout operational principles of cell circuit 800 as previously described with respect to FIGS. 2-4.

FIG. 9 illustrates another example magnetic-Josephson-junction-based cell topology 900 that, like cell circuit 800, functions as a software-programmable RQL gate that is extremely compact. In contrast to cell circuit 800, cell circuit 900 omits transformer 804, but otherwise can function similarly, with magnetic Josephson junction MJJ being used to write a binary state H to the loop formed by magnetic Josephson junction MJJ, escape Josephson junction $JJ_{ESC}$, and the secondary inductor of transformer 902. The logical output produced is as shown in FIG. 9. In either cell circuit FIG. 8 or FIG. 9, signal $DC_{2IN}$ can provide fine-tuning, as discussed previously with respect to cell circuits 300 and 400.

Figure 10:
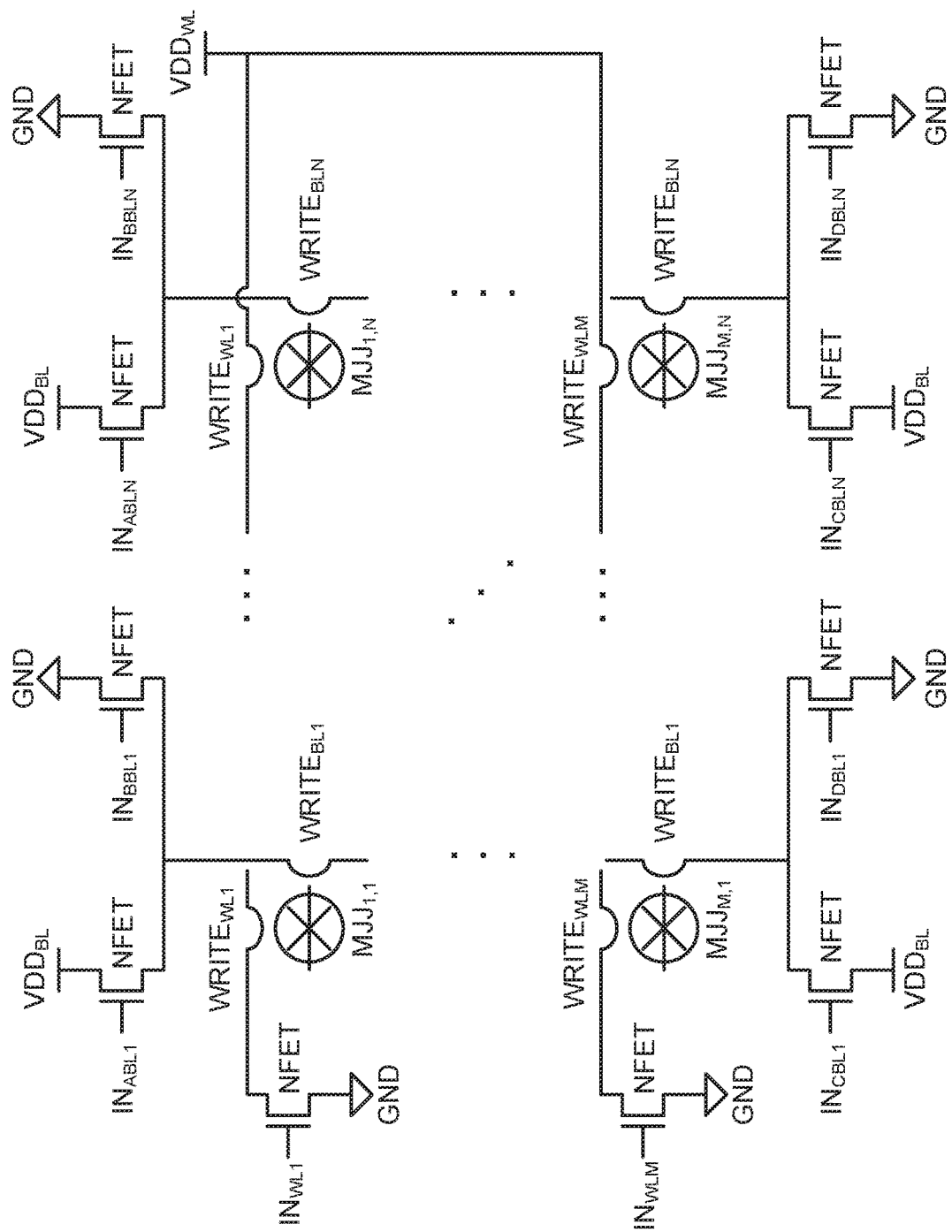
FIG. 10 is a circuit diagram of CMOS-based write circuitry for the magnetic Josephson junctions (MJJs) of MJJ-based JTLBSLA logic cells.

Mixed-signal circuits that generate the positive and negative currents necessary to write the magnetic Josephson junction MJJ to two distinct states and to drive DC transformer 804 to two distinct states, as discussed in the above paragraph, can be similar to those developed for Josephson magnetic random access memory (JMRAM). The flux generation rates required of the write circuits for software-programmable logic are advantageously much less than those required for JMRAM. RQL circuits or CMOS circuits can be used as write circuitry for the magnetic Josephson junctions. FIG. 10 depicts example CMOS write circuits that can produce the characteristic waveforms used to write the magnetic Josephson junctions for an M×N array of cells of the type shown in FIG. 8 or 9.

JTLBSLAs as described herein can support a broad range of functional capabilities, including capabilities described in U.S. Pat. Nos. 9,595,970 and 9,613,699, which are incorporated by reference. The JTLBSLAs described herein can thus implement mask-programmable logic arrays (MPLAs), software-programmable logic arrays (SPLAs), content-addressable memory (CAM), and interchangeable logic and memory (ILM). As high bandwidth integrated logic and memory, JTLBSLAs have applications both in CPUs and FPGAs, including the JTLBSFPGAs illustrated in FIGS. 11 and 12, as described below. Being field-programmable, the JTLBSLAs described herein provide algorithmic flexibility and extensibility.

Figure 11:
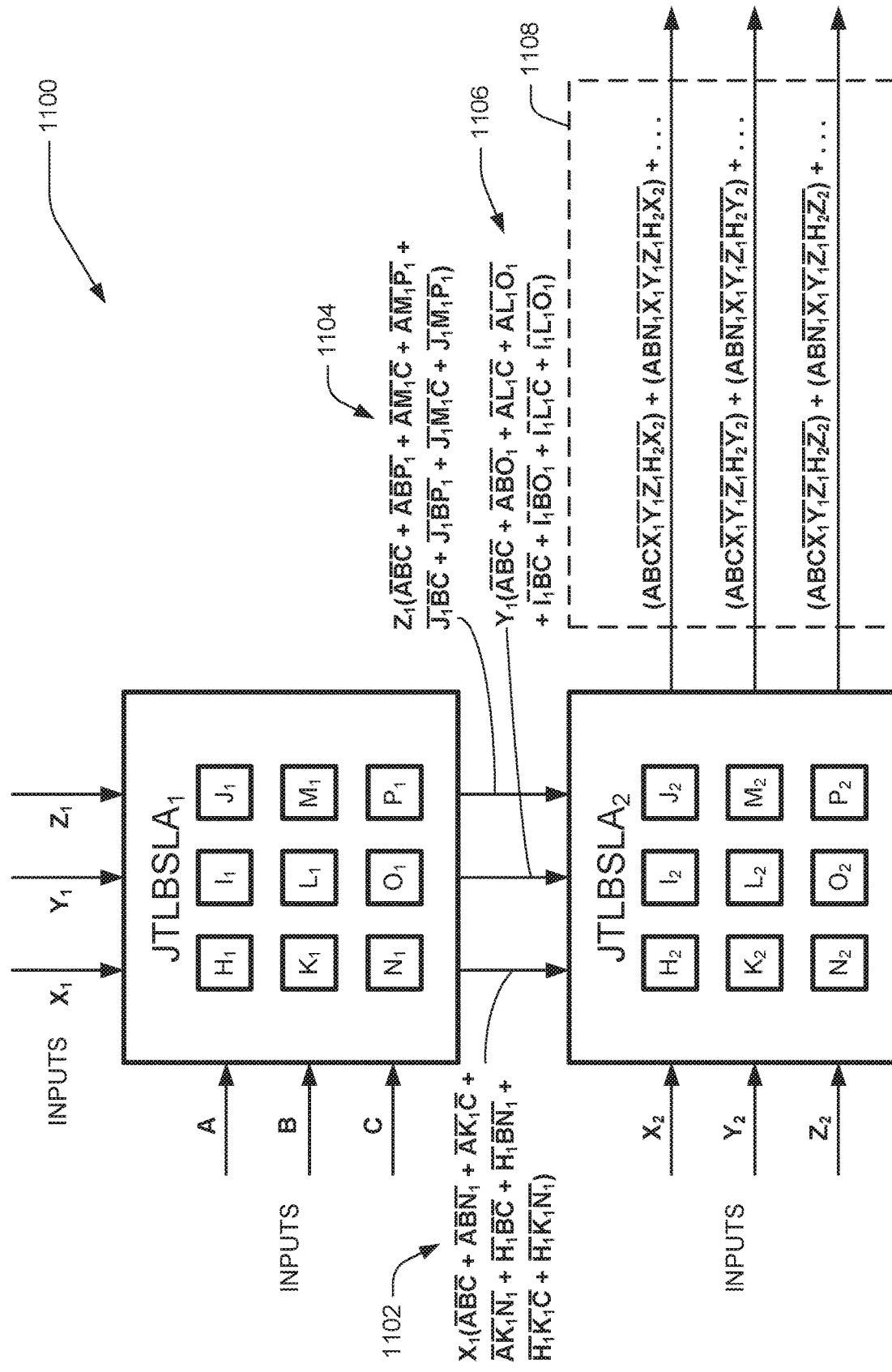
FIG. 11 is a block diagram of an example JTL-based superconducting field programmable gate array (JTLBSFPGA).

FIG. 11 depicts an example JTLBSFPGA 1100 combining two 3×3 JTLBSLAs, first array $JTLBSLA_1$ and second array $JTLBSLA_2$, each corresponding, for example, to JTLBSLA 100 in FIG. 1, configured to generate desired sum-of-products output functions 1108 offering a full range of Boolean expression. In the example of FIG. 11, the data line outputs of first array $JTLBSLA_1$ are connected to the selection line inputs of array $JTLBSLA_2$, rather than to the data line inputs $X_2$, $Y_2$, $Z_2$ of array $JTLBSLA_2$. The intermediate Boolean expressions generated at the data line outputs of $JTLBSLA_1$ (and fed into the selection line inputs of $JTLBSLA_2$) are shown as expressions 1102, 1104, 1006. As illustrated by the length and complexity of the final output logic expressions 1108 of this example, which for simplicity of illustration are not shown in full in FIG. 11, the mapping of a register-transfer level (RTL) description into a configuration of a plurality of JTLBSLAs can be handled by computers, e.g., using synthesis engines. In the resulting sum-of-products output functions 1108, the product terms can be included, or removed, by programming (writing) the logic states of the cells in the JTLBSLAs, which are labeled as $H_1$ through $P_1$ in $JTLBSLA_1$ and $H_2$ through $P_2$ in $JTLBSLA_2$. FIG. 11 is meant to serve as only an example configuration; it is contemplated that a JTLBSFPGA can be made of any number of JTLBSLAs arranged in any way with respect to each other, each JTLBSLA in the JTLBSFPGA being of any number of rows and columns of logical cells (e.g., M×N, where M and N are each two or greater).

Figure 12:
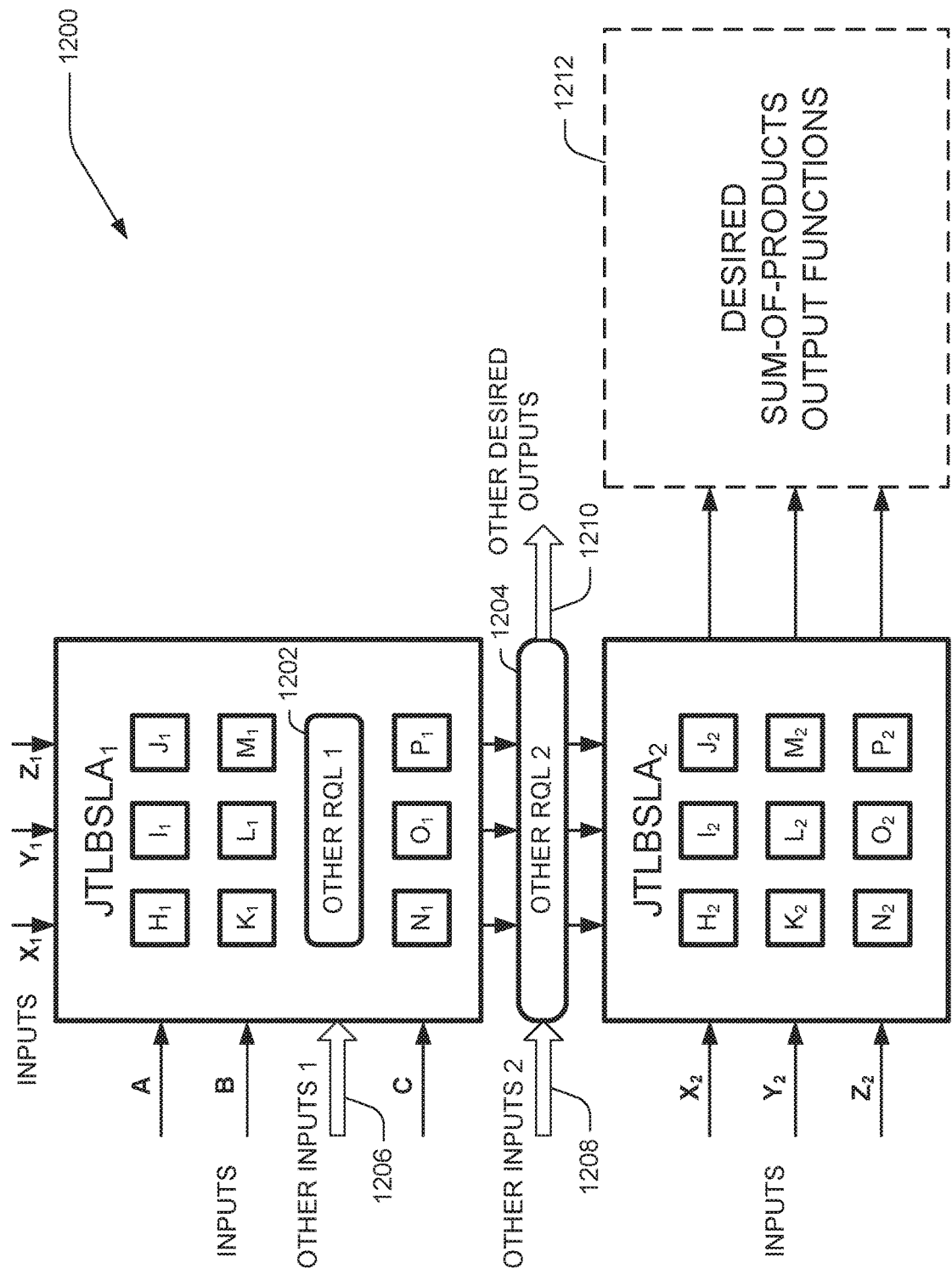
FIG. 12 is a block diagram of an example JTLBSFPGA incorporating intra-array and inter-array reciprocal quantum logic (RQL).

FIG. 12 depicts another example JTLBSFPGA 1200 made up of two connected JTLBSLAs, first array $JTLBSLA_1$ and second array $JTLBSLA_2$, configured to generate desired sum-of-products output functions 1212, and further including additional hard-coded RQL integrated within or between JTLBSLAs. Like in the example of FIG. 11, the data line outputs of first array $JTLBSLA_1$ of JTLBSFPGA 1200 are connected to the selection line inputs of array $JTLBSLA_2$ of JTLBSFPGA 1200. Each of these logics can consist of any set or arrangement of RQL gates, such as those found in RQL libraries, that can be fabricated on the chip along with JTLBSLAs that make up a JTLBSFPGA. In the illustrated example of FIG. 12, $JTLBSLA_1$ is illustrated as having intra-array logic other RQL 1 1202 that can modify the outputs of logic cells having labeled states $K_1$, $L_1$, and $M_1$ to produce the inputs for logic cells having labeled states $N_1$, $O_1$, and $P_1$, respectively, based on other inputs 1 1206. This illustration is meant only to serve as an example; intra-array logic can be at any location within a JTLBSLA, and can modify any intra-array logical cell inputs or outputs.

Also in the illustrated example of FIG. 12, JTLBSFPGA 1200 is illustrated as having inter-array logic other RQL 2 1204 to modify the data line outputs of $JTLBSLA_1$ to provide the selection line inputs of $JTLBSLA_2$, based on other inputs 2 1208, and potentially to also produce other desired outputs 1210 based on the data line outputs of $JTLBSLA_1$. Again, this illustration is meant only to serve as an example; inter-array logic can be at any location within a JTLBSFPGA, can modify any inter-array logical cell inputs or outputs, can provide other outputs from the JTLBSFPGA or not, and can be based on other inputs to the JTLBSFPGA or not. In contrast to any software-programmable cells that may be in each JTLBSLA (e.g., having states $H_1$, etc.), the intra-array RQL 1202 or inter-array RQL 1204 is hard-coded, i.e., what has been referred to herein as "mask-programmed," and may consist of any number, arrangement, or combination of gates to provide any type of logic operations or logic transformations based on the corresponding inputs to the RQL 1202 or 1204.

JTLBSLAs, as described herein, provide attractive features beyond those of RQL gates or previously disclosed superconducting logic arrays (SLAs). JTLBSLAs mesh directly with RQL, at both ultimate and interim inputs and outputs, without needing any signal conversion circuitry, because the logic cells use standard RQL signaling. Unlike SLAs based on JMRAM, JTLBSLAs do not require word line drivers, flux pumps, or sense amplifiers. JTLBSLAs have none of the component overhead of JMRAM, except a decoder where used as a memory. JTLBSLAs can run at resonator frequencies (e.g., up to about ten gigahertz) just like RQL. Because they implement targeted algorithms at RQL frequencies, they perform more useful computation per unit die area than a general-purpose RQL CPU. Such a targeted algorithmic capability dramatically reduces run time, increases energy efficiency, and increases computational bandwidth compared to a general-purpose RQL CPU. JTLBSLAs offer bandwidth and process simplicity whereas previously disclosed SLAs may offer lower latency and density.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. For example, it will be understood that the conventions used herein for logical "0" and logical "1" can be swapped. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A Josephson-junction-based superconducting reciprocal quantum logic (RQL) cell circuit comprising:
    a logic evaluation loop comprising:
        a secondary inductor of a selection input transformer through which an RQL-compliant read selection signal is provided to the logic evaluation loop from a read selection Josephson transmission line (JTL);
        a read data input from which an RQL-compliant read data signal is provided to the logic evaluation loop from a read data JTL; and
        an escape Josephson junction (JJ) configured to trigger or not to trigger so as to block the read data signal from propagating to an output JTL or to act as a superconducting short to pass the read data signal to the output JTL, respectively, based on bias conditions established by the read selection signal,
    wherein the logic evaluation loop is configured to readout an RQL-compliant logical output signal based on the read selection signal and the read data signal.

2. The circuit of claim 1, wherein the circuit is configured to produce the logical output signal as the logical AND of the read data signal and the read selection signal.

3. The circuit of claim 1, wherein the logic evaluation loop further comprises a secondary inductor of a first bias transformer, the secondary inductor of the first bias transformer being configured to contribute an induced first DC bias current to a loop current flowing in the logic evaluation loop.

4. The circuit of claim 3, wherein the first bias transformer is configured to provide the induced first DC bias current such that alters the function of the circuit from an AND function to a pass-through function based on the induced first DC bias current.

5. The circuit of claim 1, wherein the logic evaluation loop further comprises a secondary inductor of a second bias transformer arranged between the read selection JTL and a primary inductor of the selection input transformer, wherein a primary inductor of the second bias transformer is configured to provide a tuning DC bias current from a second DC bias line to adjust the amplitude of a loop current flowing in the logic evaluation loop to a tuned current value that is below the critical current of the escape JJ in absence of a contribution to the loop current from the read data signal.

6. The circuit of claim 5, wherein the tuned current value is between about fifty percent and about ninety percent of the critical current of the escape JJ in the presence of contributions to the loop current from the read selection signal.

7. A JTL-based superconducting logic array (JTLBSLA) circuit comprising at least first and second instances of the circuit of claim 5 as first and second logic cells, and further comprising at least first and second individually controllable DC bias lines respectively arranged as the DC bias lines of the first and second logic cells, such that the first and second logic cells are individually and contemporaneously each configurable as either an AND logic cell or a pass-through logic cell.

8. The circuit of claim 1, wherein the logic evaluation loop further comprises exactly two inductors, only one of which, the secondary inductor of the selection input transformer, is an inductor belonging to a transformer, and wherein the circuit is configured to function as a pass-through logic cell that propagates the signal content of the read data line as the logical output signal irrespective of the state of the read selection line.

9. A JTL-based superconducting logic array (JTLBSLA) circuit comprising:
    a plurality of logic cell circuits of claim 1 arranged in an array of a plurality of rows, numbering M, and a plurality of columns, numbering N;
    a plurality of selection lines, numbering M, configured to each provide a selection binary value to each of N cells in a corresponding row; and
    a plurality of data lines, numbering N, configured to each provide a data binary value to a first cell in a corresponding column,
    wherein each cell in the array other than the last cell in each column provides an output to a next cell in a corresponding column, and the last cell in each column provides an output representative of an evaluation of a generalized logic function.

10. The JTLBSLA circuit of claim 9, wherein the generalized logic function for each column is a sum-of-products function based on:
    the selection binary values provided on the selection lines; and
    the data binary value provided to the respective column.

11. The circuit of claim 1, wherein the read selection Josephson transmission line comprises a special JTL configured as a signal splitter for RQL-compliant signals comprising single flux quantum (SFQ) pulses, such that the read selection signal is provided to both the logic evaluation loop and to another logic cell circuit.

12. The circuit of claim 11, wherein the special JTL comprises a JTL comprising:
    a special JTL input at a first end of the JTL;
    a special JTL output at a second end of the JTL;
    first and second inductors arranged in a signal path of the JTL between the input and the output;
    at least two Josephson junctions connected between the signal path and ground; and
    a special JTL split output connected at a node between the first and second inductors.

13. The circuit of claim 11, wherein the special JTL comprises:
    a special JTL input;
    a first inductor connected between the special JTL input and a splitting node;
    a first Josephson junction connected between the splitting node and ground;
    a second inductor connected between the splitting node and a second node;

a second Josephson junction connected between the second node and ground;

a third inductor connected between the second node an a special JTL output;

a fourth inductor connected between the splitting node and a third node;

a third Josephson junction connected between the third node and ground; and a fifth inductor connected between the third node an a special JTL split output.

14. The circuit of claim 1, wherein the circuit is mask-programmable and not software-programmable.

15. A mask-programmable Josephson-transmission-line-based superconducting reciprocal quantum logic (RQL) cell circuit comprising:

a read data line comprising a first Josephson transmission line (JTL) arranged between a read data input and a read data output; and a read selection line arranged orthogonally to the read data line and comprising a second JTL arranged between a read selection input and a read selection output, wherein the mask-programmable cell circuit is a pass-through cell configured to force a cell state of logical "0" such that a signal provided to the read data input is always propagated to the read data output.

16. A Josephson-transmission-line-based superconducting logic array (JTLBSLA) circuit comprising:

a plurality of logic cells arranged in an array of a plurality of rows, numbering M, and a plurality of columns, numbering N, at least one of the logic cells comprising the cell circuit of claim 15, and at least one other of the logic cells being a software-programmable logic cell, wherein the software-programmable logic cell is configured to store a programmable digital state in a superconducting loop and to set the programmable digital state to one of a first logic state and a second logic state at operation time;

a plurality of JTL-based selection lines, numbering M, configured to each provide a selection binary value as input to each of N cells in a corresponding row; and a plurality of JTL-based data lines, numbering N, configured to each provide a data binary value as input to a first cell in a corresponding column, wherein each cell in the array other than the last cell in each column provides an output as input to a next cell in a corresponding column or to an RQL gate, and the last cell in each column provides an array output representative of an evaluation of a generalized logic function.

17. The JTLBSLA circuit of claim 16, wherein the generalized logic function for each column is a sum-of-products function based on:

the programmable or hard-coded digital state of each cell in the respective column;

the selection binary values provided on the selection lines; and the data binary value provided to the respective column.

18. The JTLBSLA circuit of claim 17, wherein the generalized logic function for each column is the data binary value provided to the respective column logically ANDed with the logical negation of the logical OR of M logical AND terms, each of the M logical AND terms being the logical AND of the programmable or hard-coded digital state of the cell in the respective column and a respective row and the selection binary value provided on the respective selection line of the respective row.

\* \* \* \* \*